(12) United States Patent
Belli et al.

(10) Patent No.: US 10,965,117 B2
(45) Date of Patent: Mar. 30, 2021

(54) METHOD FOR CONTROLLING A LEAKAGE CURRENT PROTECTION DEVICE IN A PHOTOVOLTAIC APPARATUS

(71) Applicant: ABB Schweiz AG, Baden (CH)

(72) Inventors: Marco Belli, Signa (IT); Diego Palumbo, Florence (IT)

(73) Assignee: ABB Schweiz AG, Baden (CH)

( * ) Notice: Subject to any disclaimer, the term of this patent is extended or adjusted under 35 U.S.C. 154(b) by 161 days.

(21) Appl. No.: 16/465,366

(22) PCT Filed: Nov. 30, 2016

(86) PCT No.: PCT/EP2016/079290
§ 371 (c)(1),
(2) Date: May 30, 2019

(87) PCT Pub. No.: WO2018/099553
PCT Pub. Date: Jun. 7, 2018

(65) Prior Publication Data
US 2019/0393695 A1 Dec. 26, 2019

(51) Int. Cl.
*H02H 1/04* (2006.01)
*H02H 3/353* (2006.01)
(Continued)

(52) U.S. Cl.
CPC .............. *H02H 3/353* (2013.01); *G01R 31/50* (2020.01); *H02H 1/04* (2013.01); *H02H 3/16* (2013.01); *H02H 7/20* (2013.01); *H02S 40/32* (2014.12)

(58) Field of Classification Search
CPC ............ H02H 1/04; H02H 3/353; H02H 3/16; H02H 7/20; H02S 40/32; G01R 31/50
See application file for complete search history.

(56) References Cited

U.S. PATENT DOCUMENTS 3,987,425 A * 10/1976 Lawton ............ G01R 19/16571
340/530
2002/0089799 A1 * 7/2002 Juncu ..................... H02H 3/337
361/42
(Continued)

FOREIGN PATENT DOCUMENTS

DE 102015204376 A1 9/2016
JP 2012199196 A 10/2012

OTHER PUBLICATIONS

European Patent Office, International Search Report & Written Opinion issued in corresponding Application No. PCT/EP2016/079290, dated Sep. 1, 2017, 13 pp.

*Primary Examiner* — Harry R Behr
(74) *Attorney, Agent, or Firm* — Taft Stettinius & Hollister LLP

(57) ABSTRACT

The application includes a method to control a leakage current protection device in a photovoltaic apparatus, said photovoltaic apparatus being adapted to be electrically connected to an electric power distribution grid having one or more phase voltages at an AC section of the photovoltaic apparatus. The method includes executing a first control procedure to control the leakage current protection device, the first control procedure providing for a comparison of current check values indicative of leakage currents in the photovoltaic apparatus with one or more predefined current threshold values for the leakage currents. The method includes executing a monitoring procedure to check the phase voltages and identify possible relevant positive transients of the phase voltages. If the monitoring procedure identifies relevant positive transients of the phase voltages, one or more new current threshold values for the leakage currents are provided, the execution of the first control procedure is terminated and a second control procedure to control the leakage current protection device is executed, the (Continued)

Figure 1:
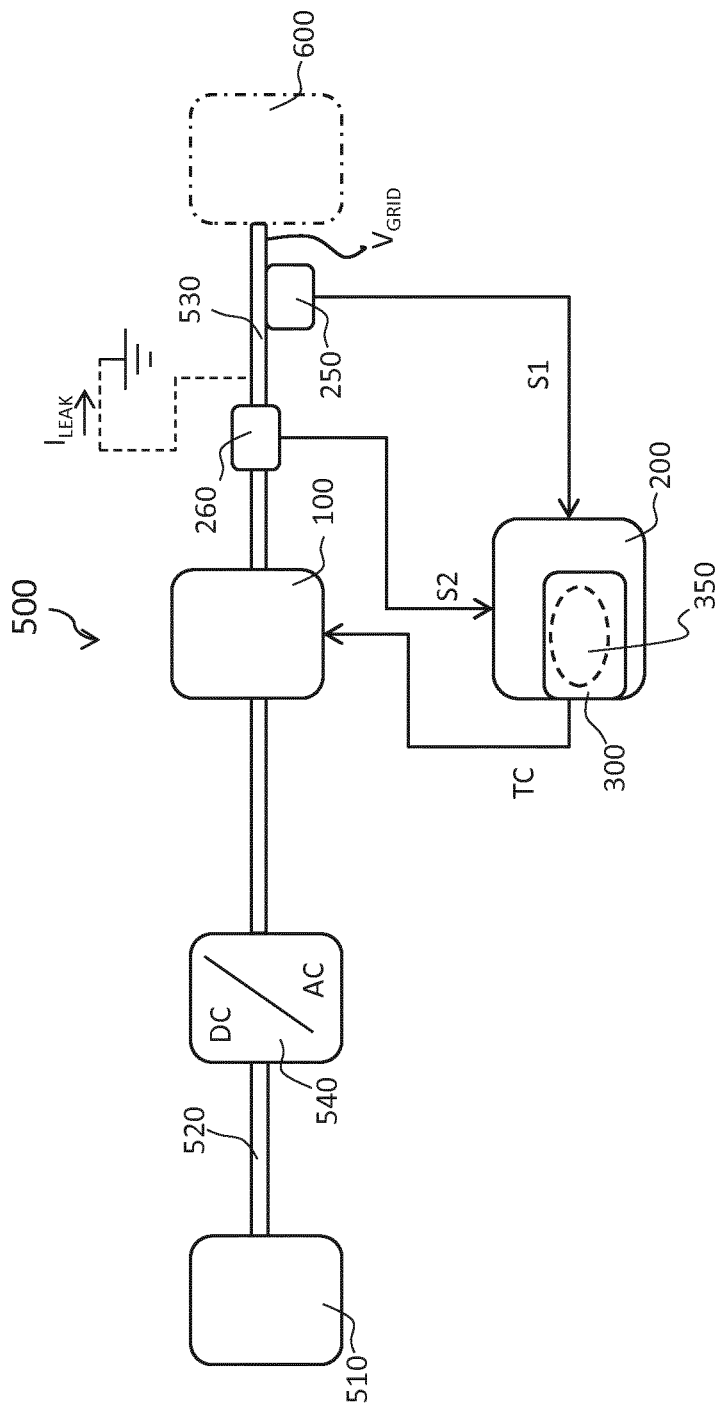

second control procedure providing for a comparison of the current check values with the new current threshold values for the leakage currents, the second control procedure being executed for a predefined time interval only. After the predefined period of time has passed, the execution of the second monitoring procedure is terminated and the first control procedure is again executed.

18 Claims, 4 Drawing Sheets

(51) Int. Cl.
     *H02S 40/32*      (2014.01)
     *G01R 31/50*      (2020.01)
     *H02H 3/16*      (2006.01)
     *H02H 7/20*      (2006.01)

(56) References Cited

U.S. PATENT DOCUMENTS

| | | | |
|---|---|---|---|
| 2003/0125885 A1* | 7/2003 | Dougherty | H02H 3/32 |
| | | | 702/58 |
| 2011/0007443 A1* | 1/2011 | Crookham | H02H 3/347 |
| | | | 361/93.2 |
| 2012/0063045 A1* | 3/2012 | Shearon | H02H 3/08 |
| | | | 361/65 |
| 2012/0314327 A1* | 12/2012 | Liu | H02H 3/16 |
| | | | 361/56 |
| 2016/0134105 A1 | 5/2016 | Harris et al. | |

* cited by examiner

METHOD FOR CONTROLLING A LEAKAGE CURRENT PROTECTION DEVICE IN A PHOTOVOLTAIC APPARATUS

The present invention relates to the field of photovoltaic apparatuses for electric power generation. More particularly, the present invention concerns an improved method for controlling the operation of a leakage current protection device in a photovoltaic apparatus. As is known, parasitic capacitances are usually present in a photovoltaic apparatus between the ground and some components (e.g. photovoltaic panels, AC or DC electric lines and the like) of the apparatus. The value of such parasitic capacitances may quite relevant (particularly in presence of moisture), e.g. higher than 120 nF/KW.

In many photovoltaic apparatuses, particularly in those employing so-called transformer-less inverters, such parasitic capacitances may be at the origin of AC leakage currents towards the ground.

Said AC leakage currents may have noticeable intensity, the value of which substantially depends on the AC voltage of the electric power distribution grid electrically connected to the photovoltaic apparatus.

For this reason, photovoltaic apparatuses are generally provided with so-called leakage current protection devices, normally at their AC section.

Typically, a leakage current protection device (e.g. a relay) is an electrically operated switch operatively coupled with the AC electric lines of the photovoltaic apparatus and controlled by a suitable control unit in such a way to interrupt said AC electric lines, when the detected leakage currents exceed given threshold levels or are subject to sudden increases.

However, it has been experienced how the arrangement of such leakage current protection devices may lead to some problems in particular circumstances, namely when the AC voltage of the electric power distribution grid is subject to positive transients (increases), as it occurs when operation of said electric power distribution grid is restored after a voltage dip or a fault event.

In these cases, in fact, increases of the AC leakage currents in the photovoltaic apparatus, which are proportional to the positive transients of the AC voltage, can be observed even in absence of relevant changes in the values of the parasitic capacitances between the components of the photovoltaic apparatus and the ground.

Such transients of the AC leakage currents towards the ground may easily lead to undesired interventions of the mentioned leakage current protection device even if no anomalous conditions in the photovoltaic apparatus are present.

As an obvious consequence, the operation of the photovoltaic apparatus may be uselessly interrupted for a relatively long time and relevant reductions in the electric energy production may occur.

The main aim of the present invention is to provide a method for controlling the operation of a leakage current protection device in a photovoltaic apparatus, which allows solving or mitigating the technical problems evidenced above.

Within this aim, an object of the present invention is to provide a method that allows efficiently managing the operation of a leakage current protection device in a photovoltaic apparatus, when positive transients of the AC voltage of the electric power distribution grid electrically connected to said apparatus occur.

A further object of the present invention is to provide a method that can be easily computer-implemented without the adoption of expensive processing resources.

These aim and objects are achieved by a method to control the operation of a leakage current protection device in a photovoltaic apparatus, according to the following claim 1 and the related dependent claims.

In a further aspect, the present invention relates to a computer program, according to the following claim 10.

In a further aspect, the present invention relates to a control unit for controlling a leakage current protection device in a photovoltaic apparatus, according to the following claim 11.

In a further aspect, the present invention relates to a photovoltaic apparatus, according to the following claim 12.

Figure 2:
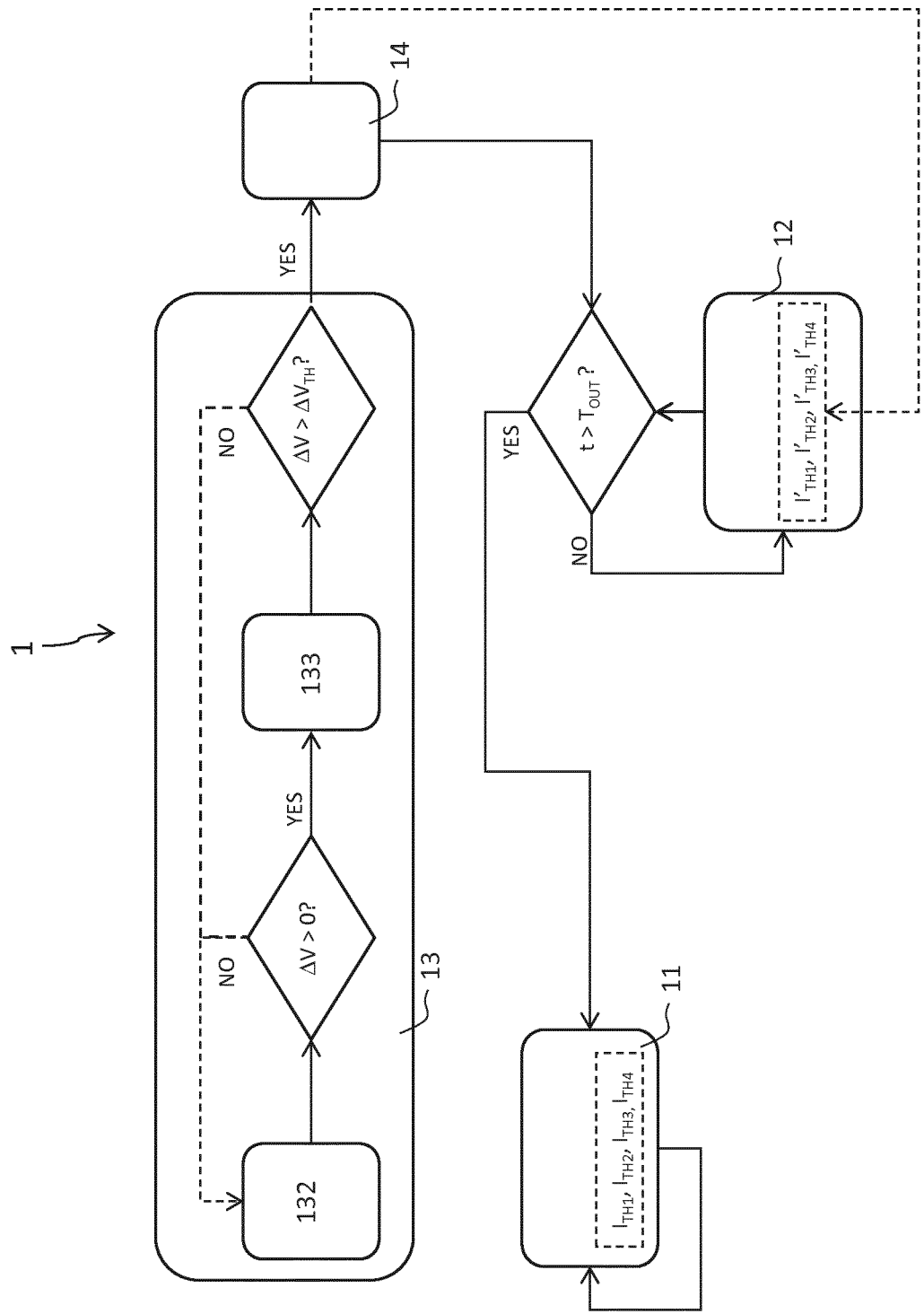
Figure 3:
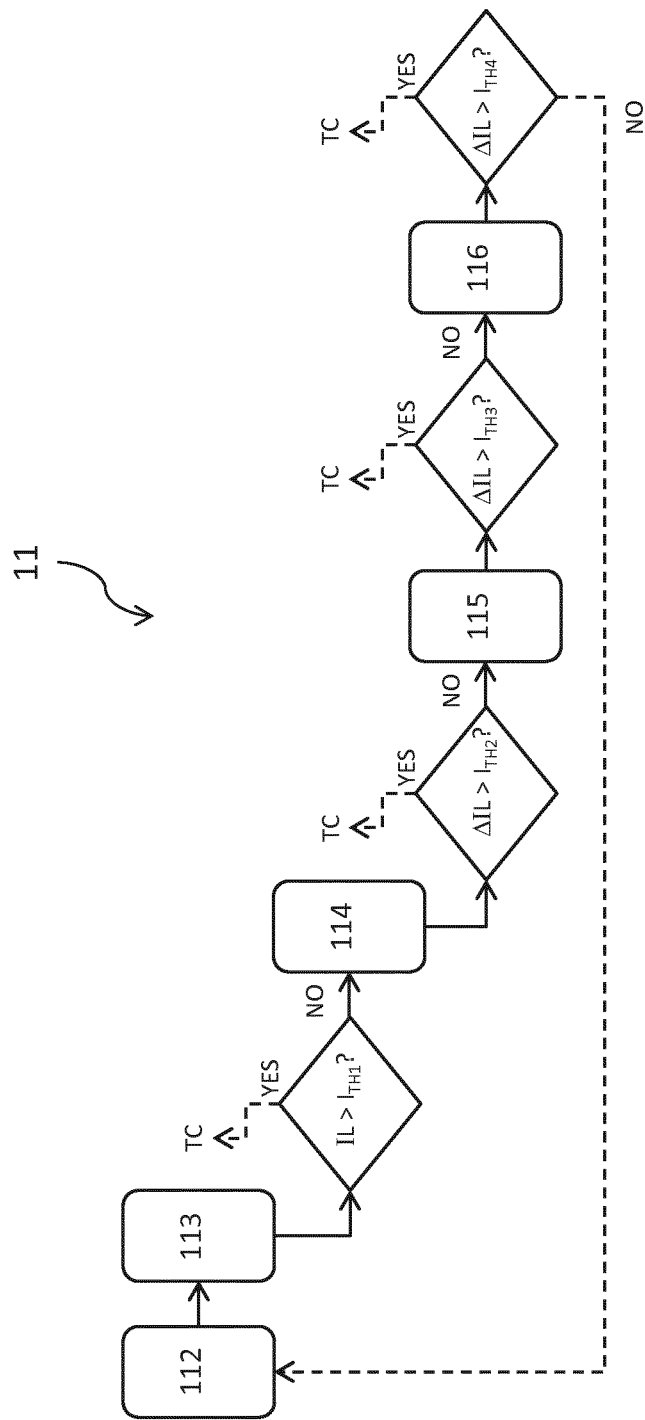
Figure 4:
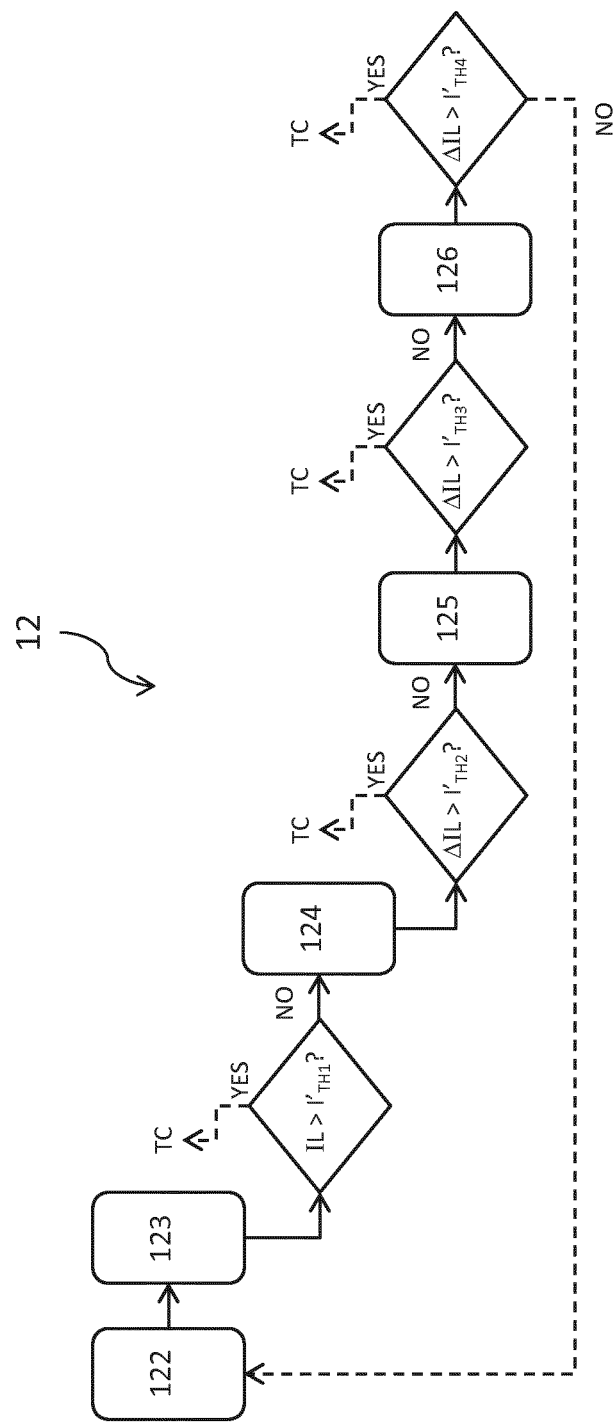

Characteristics and advantages of the present invention shall emerge more clearly from the description of preferred but not exclusive embodiments illustrated purely by way of example and without limitation in the attached drawings, in which:

FIG. 1 schematically illustrates a photovoltaic apparatus, according to the invention;

FIG. 2-4 schematically illustrate the method, according to the invention.

With reference to the mentioned figures, the present invention relates to a method 1 for controlling a leakage current protection device 100 in a photovoltaic apparatus 500 for electric power generation at low voltage electric power distribution levels.

For the sake of clarity, it is specified that the term "low voltage" refers to operating voltages lower than 1 kV AC and 1.5 kV DC.

The photovoltaic apparatus 500 comprises a DC section, which includes at least one or more photovoltaic panels 510 and one or more DC electric lines 520 (arranged in a DC electric bus) electrically connected with said photovoltaic panels.

The photovoltaic apparatus 500 comprises an AC section, which includes at least one or more AC electric lines 530 (arranged in an AC electric bus) electrically connected to an electric power distribution grid 600, which may be is of single-phase or multi-phase type.

The photovoltaic apparatus 500 comprises an inverter section, which includes at least an inverter 540 having a DC port electrically connected with the DC electric lines 520 and an AC port electrically connected with the AC electric lines 530.

Most of the components of the mentioned DC section, inverter section and AC section of the photovoltaic apparatus 500 may be of known type and will not be described in further details for the sake of brevity.

The photovoltaic apparatus 500 comprises a leakage current protection device 100 operatively associated with a section (e.g. the AC section or the DC section) of the photovoltaic apparatus.

The protection device 100 may be an electrically operated switch, e.g. a protection relay, which is operatively coupled with the AC electric lines 530 or the DC electric lines 520 in such a way to be capable of interrupting said electric lines upon receiving a trip command TC. When activated by a trip command TC, the protection device 100 is capable of electrically segregating the photovoltaic panels 510 from the electric power distribution grid 600, thereby causing the interruption of the operation of the photovoltaic apparatus 500.

The protection device 100 may be of known type and will not be described in further details for the sake of brevity.

Preferably, the protection device 100 is operatively coupled with the AC electric lines 530 of the photovoltaic apparatus and its operation will be described hereinafter with reference to this implementation for the sake of brevity, without intending to limit the scope of the invention in any way.

Preferably, the photovoltaic apparatus 500 comprises a control unit 200 operatively coupled with the protection device 100.

The control unit 200 is adapted to suitably control the operation of the protection device 100, namely to send trip commands TC to this latter in such a way to cause its intervention to interrupt the AC electric lines 530.

Preferably, the control unit 200 is operatively coupled with first sensing means 250 (e.g. one or more voltage sensors of known type), which are suitably arranged to detect the one or more phase voltages $V_{GRID}$ provided by the electric power distribution grid 600 at the AC section of the photovoltaic apparatus and send first detection signals S1 indicative of said phase voltages to the control unit 200.

Preferably, the control unit 200 is operatively coupled to second sensing means 260 (e.g. one or more current sensors of known type), which are suitably arranged to detect leakage currents towards the ground at a section of the photovoltaic apparatus and send second detection signals S2 indicative of said leakage currents to the control unit 200.

Preferably, the second sensing means 260 are suitably arranged to detect leakage currents towards the ground at the AC section of the photovoltaic apparatus.

As an alternative, the second sensing means 260 may be suitably arranged to detect leakage currents towards the ground at the DC section of the photovoltaic apparatus.

The type and the arrangement of the first and second sensing means 250, 260 may be known to those skilled in the art and will not be described in further details for the sake of brevity.

According to possible embodiments of the photovoltaic apparatus 500, the control unit 200 may be arranged on or integrated in the inverter section of the photovoltaic apparatus (e.g. on a control board of the inverter 540) or be itself be one of the control units of the inverter 540.

According to further possible embodiments of the photovoltaic apparatus 500, the control unit 200 may be a self-standing device arranged on a dedicated control board, which may be, for example, operatively associated to the inverter section of the photovoltaic apparatus, according to the needs.

Other solutions are possible and within the capacity of the skilled person.

The method 1, according to the invention, is particularly suitable for being implemented by a computerised device 300 (e.g. a microprocessor or other equivalent processing resources) and will be now described with reference to this kind of implementation.

For the sake of simplicity, the method 1 is hereinafter described with particular reference to its implementation in an embodiment of the photovoltaic apparatus 500, in which the electric power distribution grid 600 is of the single-phase type and therefore provides a single-phase voltage $V_{GRID}$ at the AC section 520 of the photovoltaic apparatus 500.

However, the method 1 can be obviously implemented with slight modifications within the capacity of the skilled person in embodiments of the photovoltaic apparatus 500, in which the electric power distribution grid 600 is of the multi-phase type (e.g. of the three-phase type) and provides multiple (e.g. three) phase voltages.

According to the invention, the method 1 comprises the step of cyclically executing a first control procedure 11 to control the protection device 100.

The first control procedure 11 uses one or more predefined current threshold values $I_{TH1}$, $I_{TH2}$, $I_{TH3}$, $I_{TH4}$ to determine whether anomalous AC leakage currents $I_{LEAK}$, which require the intervention of the protection device 100, are present.

In parallel, the method 1 comprises the step of executing a monitoring procedure 13 to check the phase voltage $V_{GRID}$ of the electric power distribution grid 600 (e.g. at the AC section 260 of the photovoltaic apparatus) in order to identify possible relevant positive transients of said phase voltage.

If the monitoring procedure 13 identifies relevant positive transients of the phase voltage $V_{GRID}$, the method 1 comprises the step 14 of providing one or more new current threshold values $I'_{TH1}$, $I'_{TH2}$, $I'_{TH3}$, $I'_{TH4}$, which are preferably higher than the predefined threshold values $I_{TH1}$, $I_{TH2}$, $I_{TH3}$, $I_{TH4}$, are provided.

The method 1 further provides for terminating the first control procedure 11 (and preferably the monitoring procedure 13) and executing a second control procedure 12 to control the protection device 100.

The second control procedure 12 is cyclically executed for a predetermined time interval $T_{OUT}$ only.

The second control procedure 12 uses the new current threshold values $I'_{TH1}$, $I'_{TH2}$, $I'_{TH3}$, $I'_{TH4}$ to determine whether anomalous AC leakage currents $I_{LEAK}$, which require the intervention of the protection device 100, are present.

Once the time interval $T_{OUT}$ has passed, the second control procedure 12 is terminated and the first control procedure 11 (and preferably the monitoring procedure 13) is again cyclically executed to control the protection device 100

From the above, it is evident how the basic concept of the method 1 of the invention consists in monitoring the AC voltage electric power distribution grid 600 and adopting more relaxed conditions to determine whether anomalous leakage currents are present in case relevant positive transients of the said AC voltage are identified.

In this way, undesired interventions of the current protection device 100 may be avoided in the circumstances (e.g. when the electric power distribution grid 600 is restored after a voltage dip event or a fault event) in which possible measured increases of the leakage currents $I_{LEAK}$ might not be unequivocally indicative of anomalous conditions in the photovoltaic apparatus.

The method 1, according to the invention, thus provides a robust control of the protection device 100 with high immunity to voltage transients in the electric power distribution grid 600. This allows avoiding or reducing the occurrence of useless interruptions of the operation photovoltaic apparatus 500.

Preferably, in a digital computer implementation of the method 1, the procedures 11, 12, 13 described above are executed at any given sampling period $T_S$ adopted to acquire detection values indicative of the physical quantities (e.g. leakage currents $I_{LEAK}$, phase voltages $V_{GRID}$) checked or processed during said procedures.

In other words, the procedures 11, 12, 13 described above are preferably executed within a time $T_S = t_2 - t_1$ where $t_1$, $t_2$ are subsequent sampling instants, in which subsequent detection values indicative of the physical quantities checked or processed during said procedures.

Preferably, in a digital computer implementation of the method 1, the time interval $T_{OUT}$ is equal to some tens of sampling periods Ts, e.g. $T_{OUT} \approx 50 T_S$.

Referring to FIGS. 2-4, the method 1, according to the invention, is here described in more details.

As mentioned above, the method 1 comprises the step of cyclically executing the first control procedure 11 to control the leakage current protection device 100.

The first control procedure 11 provides for comparing some current check values IL, ΔIL, which are indicative of the behaviour of the AC leakage currents $I_{LEAK}$ in the photovoltaic apparatus, with one or more predefined current threshold values $I_{TH1}$, $I_{TH2}$, $I_{TH3}$, $I_{TH4}$ foreseen for said leakage currents in order to determine whether anomalous conditions are present and the protection device 100 has to be activated.

Preferably, the predefined current threshold values $I_{TH1}$, $I_{TH2}$, $I_{TH3}$, $I_{TH4}$ are stored in a storage memory.

In general, the number and the magnitude of said predefined current threshold values $I_{TH1}$, $I_{TH2}$, $I_{TH3}$, $I_{TH4}$ depend on the processing steps implemented by the first control procedure 11.

Referring to FIG. 3, a preferred sequence of steps for the first control procedure 11 is shown.

Preferably, the control procedure 11 comprises the step of obtaining the current check values IL, ΔIL (reference 112).

Preferably, the mentioned current check values comprises a first current check value IL, which is indicative of the RMS or peak value of the leakage currents $I_{LEAK}$, and a second current check value ΔIL, which is indicative the variation of the leakage currents $I_{LEAK}$ (more particularly of variation of the RMS or peak value of said leakage currents) over time (e.g. over one or more sampling periods $T_s$). In practice, the second current check value ΔIL is indicative of the slope variation (or derivative) of the leakage currents $I_{LEAK}$.

Preferably, the step of obtaining the current check values IL, ΔIL comprises the step of acquiring current detection values S2' indicative of the leakage currents $I_{LEAK}$ and the step of calculating the current check values IL, ΔIL on the base of said current detection values. Conveniently, in a digital computer implementation of the method 1, the mentioned current detection values S2' are obtained by properly sampling the second detection signals S2 provided by the second sensing means 260.

Preferably, the control procedure 11 then comprises a step of comparing the current check values IL, ΔIL with the current threshold values $I_{TH1}$, $I_{TH2}$, $I_{TH3}$, $I_{TH4}$ (references 113-116).

Preferably, if the current check values IL, ΔIL exceed one or more of the current threshold values $I_{TH1}$, $I_{TH2}$, $I_{TH3}$, $I_{TH4}$, the control procedure 11 comprises the step of generating a trip command TC for the protection device 100, thereby causing the activation of this latter.

Conveniently, the comparison between the current check values IL, ΔIL and the current threshold values $I_{TH1}$, $I_{TH2}$, $I_{TH3}$, $I_{TH4}$ occurs according to the preferred comparison sequence described in the following.

The first current check value IL is compared with a first current threshold value $I_{TH1}$ (reference 113). The first current threshold value $I_{TH1}$ is indicative of a maximum value acceptable for the leakage currents $I_{LEAK}$.

If the first current check value IL exceeds the first current threshold value $I_{TH1}$, a trip command TC for the protection device 100 is generated.

If the first current check value IL does not exceed the first current threshold value $I_{TH1}$, the second current check value ΔIL is compared with a second current threshold value $I_{TH2}$ (reference 114). The second current threshold value $I_{TH2}$ is indicative of a first slope variation value acceptable for the leakage currents $I_{LEAK}$.

If the second current check value ΔIL exceeds the second current threshold value $I_{TH2}$, a trip command TC for the protection device 100 is generated.

If the second current check value ΔIL does not exceed the second current threshold value $I_{TH2}$, the second current check value ΔIL is compared with a third current threshold value $I_{TH3}$ (reference 115). The third current threshold value $I_{TH3}$ is indicative of a second slope variation value acceptable for the leakage currents $I_{LEAK}$. Conveniently, the third current threshold value $I_{TH3}$ is higher than the second current threshold value $I_{TH2}$.

If the second current check value ΔIL exceeds the third current threshold value $I_{TH3}$, a trip command TC for the protection device 100 is generated.

If the second current check value ΔIL does not exceed the third current threshold value $I_{TH3}$, the second current check value ΔIL is compared with a fourth current threshold value $I_{TH4}$ (reference 116). The fourth current threshold value $I_{TH3}$ is indicative of a third slope variation value acceptable for the leakage currents $I_{LEAK}$. Conveniently, the fourth current threshold value $I_{TH4}$ is higher than the third current threshold value $I_{TH3}$.

If the second current check value ΔIL exceeds the fourth current threshold value $I_{TH4}$, a trip command TC for the protection device 100 is generated.

If the second current check value ΔIL does not exceed the fourth current threshold value $I_{TH4}$, the control procedure 11 is concluded and will be repeated at a next sampling period Ts.

Referring again to FIG. 2, in parallel with the execution of the control procedure 11, the method according to the invention provides for executing a monitoring procedure 13 to check the phase voltage $V_{GRID}$ and identify possible relevant positive transients of said phase voltage, as mentioned above.

Preferably, the monitoring procedure 13 comprises a step of obtaining voltage a check value ΔV indicative of a variation over a predetermined period of time of the phase voltage $V_{GRID}$ (reference 132). The voltage check value ΔV is in practice indicative of the slope variation (or derivative) of the phase voltage $V_{GRID}$.

Preferably, the step of obtaining the voltage check value ΔV comprises the step of acquiring voltage detection values S1' indicative of the phase voltage $V_{GRID}$ and the step of calculating the voltage check value ΔV on the base of said voltage detection values.

Conveniently, in a digital computer implementation of the method 1, the mentioned voltage detection values S1' are obtained by properly sampling the first detection signals S1 provided by the first sensing means 250.

Preferably, if the voltage check value ΔV is indicative of a negative or null variation of the phase voltage $V_{GRID}$ (condition ΔV<=0), the monitoring procedure 13 is concluded and will be repeated at a next sampling period Ts.

Preferably, if the voltage check values ΔV is indicative of a positive variation of the phase voltage $V_{GRID}$ (condition ΔV>0), the monitoring procedure 13 comprises the step of comparing the voltage check value ΔV with a predefined voltage threshold value $V_{TH}$ (reference 133). The voltage threshold value $V_{TH}$ is indicative of a maximum slope variation value (or derivative) acceptable for the phase voltage $V_{GRID}$.

Preferably, if the voltage check value ΔV does not exceed the predefined voltage threshold value $V_{TH}$, the monitoring procedure 13 is concluded and will be repeated at a next sampling period Ts.

Preferably, if the voltage check value ΔV exceed the voltage threshold value $V_{TH}$, a relevant positive transient of said phase voltage is identified. The monitoring procedure 13 is concluded. As mentioned above, preferably, the monitoring procedure 13 will be again executed after the time interval $T_{OUT}$ has passed and the control procedure 12 is again executed.

Of course, multiple check values ΔV are obtained and compared with multiple voltage threshold values $V_{TH}$, if the electric power distribution grid 600 is of the multi-phase type.

As mentioned above, if the monitoring procedure 13 identifies relevant positive transients of the phase voltage $V_{GRID}$, the method 1 provides one or more new current threshold values $I'_{TH1}$, $I'_{TH2}$, $I'_{TH3}$, $I'_{TH4}$ (step 14 of FIG. 2).

Preferably, the new current threshold values $I'_{TH1}$, $I'_{TH2}$, $I'_{TH3}$, $I'_{TH4}$ are higher than the predefined threshold values $I_{TH1}$, $I_{TH2}$, $I_{TH3}$, $I_{TH4}$. In this way, they are indicative of more relaxed conditions to determine whether anomalous leakage currents are present.

According to a possible embodiment of the invention, the new current threshold values $I'_{TH1}$, $I'_{TH2}$, $I'_{TH3}$, $I'_{TH4}$ are predefined and conveniently stored in a storage memory. In this case, the step of providing the new current threshold values basically consists in uploading said new current threshold values from said storage memory.

According to a possible embodiment of the invention, the new current threshold values $I'_{TH1}$, $I'_{TH2}$, $I'_{TH3}$, $I'_{TH4}$ are dynamically calculated by suitably processing the predefined current threshold values $I_{TH1}$, $I_{TH2}$, $I_{TH3}$, $I_{TH4}$.

In this case, the step of providing said new current threshold values $I'_{TH1}$, $I'_{TH2}$, $I'_{TH3}$, $I'_{TH4}$ comprises the following steps:

acquiring current detection values S2' indicative of said leakage currents;

calculating threshold correction values $\Delta_{TH1}$, $\Delta_{TH2}$, $\Delta_{TH3}$, $\Delta_{TH4}$ to correct the predefined current threshold values $I_{TH1}$, $I_{TH2}$, $I_{TH3}$, $I_{TH4}$ basing on said current detection values S2' and the voltage check value ΔV;

calculating the new current threshold values $I'_{TH1}$, $I'_{TH2}$, $I'_{TH3}$, $I'_{TH4}$ basing on said predefined current threshold values $I_{TH1}$, $I_{TH2}$, $I_{TH3}$, $I_{TH4}$ and the threshold correction values $\Delta_{TH1}$, $\Delta_{TH2}$, $\Delta_{TH3}$, $\Delta_{TH4}$.

In practice, according to this embodiment, threshold correction values $\Delta_{TH1}$, $\Delta_{TH2}$, $\Delta_{TH3}$, $\Delta_{TH4}$ are calculated basing on the behaviour of the detected leakage currents and phase voltage. The new current threshold values are then calculated from the predefined current threshold values as:
$I'_{TH1} = I_{TH1} + \Delta_{TH1}$; $I'_{TH2} = I_{TH2} + \Delta_{TH2}$; $I'_{TH3} = I_{TH3} + \Delta_{TH3}$; $I'_{TH4} = I_{TH4} + \Delta_{TH4}$.

As mentioned above, if the monitoring procedure 13 identifies relevant positive transients of the phase voltage $V_{GRID}$, the method 1 provides for terminating the first control procedure 11 (and preferably the monitoring procedure 13) and executing a second control procedure 12 to control the protection device 100.

The second control procedure 12 is configured to compare the current check values IL, ΔIL, which are indicative of the behaviour of the AC leakage currents $I_{LEAK}$ in the photovoltaic apparatus, with the new current threshold values $I'_{TH1}$, $I'_{TH2}$, $I'_{TH3}$, $I'_{TH4}$ foreseen for said leakage currents in order to determine whether anomalous conditions are present and the protection device 100 has to be activated.

In general, the number and the magnitude of said new current threshold values $I'_{TH1}$, $I'_{TH2}$, $I'_{TH3}$, $I'_{TH4}$ depend on the processing steps implemented by the second control procedure 12.

Referring to FIG. 4, a preferred sequence of steps for the second control procedure 12 is shown.

Preferably, the control procedure 12 comprises a step of obtaining the current check values IL, ΔIL (references 122).

As mentioned above, the mentioned current check values preferably comprises a first current check value IL, which is indicative of the RMS or peak value of said leakage currents, and a second current check value ΔIL, which is indicative the variation of said leakage currents over time.

Preferably, similarly for the control procedure 11 described above, the step of obtaining the current check values IL, ΔIL comprises the step of acquiring current detection values S2' indicative of said leakage currents and the step of calculating the current check values IL, ΔIL on the base of said current detection values.

Preferably, the control procedure 12 comprises a step of comparing the current check values IL, ΔIL with the new current threshold values $I'_{TH1}$, $I'_{TH2}$, $I'_{TH3}$, $I'_{TH4}$ (references 123-126).

Preferably, if the current check values IL, ΔIL exceed one or more of the current threshold values $I'_{TH1}$, $I'_{TH2}$, $I'_{TH3}$, $I'_{TH4}$, the control procedure 12 comprises the step of generating a trip command TC for the protection device 100, thereby causing the activation of this latter.

Conveniently, the comparison between the current check values IL, ΔIL and the new current threshold values $I'_{TH1}$, $I'_{TH2}$, $I'_{TH3}$, $I'_{TH4}$ occurs according to the preferred comparison sequence described in the following.

The first current check value IL is compared with a first new current threshold value $I'_{TH1}$ (reference 123). The first new current threshold value $I'_{TH1}$ is indicative of a maximum value acceptable for the leakage currents $I_{LEAK}$.

If the first current check value IL exceeds the first new current threshold value $I'_{TH1}$, a trip command TC for the protection device 100 is generated.

If the first current check value IL does not exceed the first new current threshold value $I'_{TH1}$, the second current check value ΔIL is compared with a second new current threshold value $I'_{TH2}$ (reference 124). The second new current threshold value $I'_{TH2}$ is indicative of a first slope variation value acceptable for the leakage currents $I_{LEAK}$.

If the second current check value ΔIL exceeds the second new current threshold values $I'_{TH2}$, a trip command TC for the protection device 100 is generated.

If the second current check value ΔIL does not exceed the second new current threshold value $I'_{TH2}$, the second current check value ΔIL is compared with a third new current threshold value $I'_{TH3}$ (reference 125). The third new current threshold value $I'_{TH3}$ is indicative of a second slope variation value acceptable for the leakage currents $I_{LEAK}$. Conveniently the third new current threshold value $I'_{TH3}$ is higher than the second new current threshold value $I'_{TH2}$.

If the second current check value ΔIL exceeds the third new current threshold value $I'_{TH3}$, a trip command TC for the protection device 100 is generated.

If the second current check value ΔIL does not exceed the third new current threshold value $I'_{TH3}$, the second current check value ΔIL is compared with a fourth new current threshold value $I'_{TH4}$ (reference 126). The fourth new current threshold value $I'_{TH3}$ is indicative of a third slope variation value acceptable for the leakage currents $I_{LEAK}$. Conveniently the new fourth current threshold value $I'_{TH4}$ is higher than the new third current threshold value $I'_{TH3}$.

If the second current check value ΔIL exceeds the new fourth current threshold value I'$_{TH4}$, a trip command TC for the protection device 100 is generated.

If the second current check value ΔIL does not exceed the fourth new current threshold value I'$_{TH4}$, the control procedure 12 is concluded and will be repeated at a next sampling period Ts. As mentioned above, the second control procedure 12 is cyclically repeated until the time interval T$_{OUT}$ has passed.

When the time interval has passed, the second control procedure 12 is terminated and the first control procedure (and possibly the monitoring procedure 13) is newly started for being cyclically executed.

The method, according to the invention, is particularly suitable for being implemented by a computerised device 300 capable of storing and executing software instructions to carry out said method.

Preferably, the computerised device 300 is included in the control unit 200.

The method, according to the present invention, is quite effective in managing the operation of the protection device 100 when the AC voltage V$_{GRID}$ provided by the electric power distribution grid 600 is not stable, more particularly is subject to positive transients that might lead to undesired interventions of the protection device itself.

As mentioned above, the method, according to the invention, ensures a robust control of the protection device 100 with high immunity to voltage transients in the electric power distribution grid 600, which allows improving the management of the operation of the photovoltaic apparatus.

The method, according to the invention, is particularly adapted for being digitally implemented by computer resources that can be installed on board the photovoltaic apparatus, preferably on the inverter of this latter.

The method, according to the invention, is thus of relatively easy and cost-effective practical implementation on the field.

The invention claimed is:

1. A method to control a leakage current protection device in a photovoltaic apparatus, said photovoltaic apparatus being adapted to be electrically connected to an electric power distribution grid having one or more phase voltages at an AC section of said photovoltaic apparatus, the method comprises:
    executing a first control procedure to control said leakage current protection device, said first control procedure providing for a comparison of current check values indicative of leakage currents in said photovoltaic apparatus with one or more predefined current threshold values for said leakage currents;
    executing a monitoring procedure to check said phase voltages and identify possible relevant positive transients of said phase voltages;
    if said monitoring procedure identifies relevant positive transients of said phase voltages, providing one or more new current threshold values for said leakage currents, terminating the execution of said first control procedure and executing a second control procedure to control said leakage current protection device, said second control procedure providing for a comparison of said current check values with said new current threshold values for said leakage currents, said second control procedure being executed for a predefined time interval only;
    after said predefined period of time has passed, terminating the execution of said second monitoring procedure and again executing of said first control procedure.

2. The method, according to claim 1, wherein said new current threshold values are higher than said predefined current threshold values.

3. The method, according to claim 2, wherein the step of obtaining said voltage check values comprises the step of acquiring voltage detection values indicative of said phase voltages and the step of calculating said voltage check values on the base of said voltage detection values.

4. The method, according to claim 2, wherein said first control procedure, comprises:
    obtaining said current check values;
    comparing said current check values with said predefined current threshold values;
    if said current check values exceed one or more of said predefined current threshold values, generating a trip command for said leakage current protection device.

5. The method, according to claim 2, wherein said second control procedure comprises:
    obtaining said current check values;
    comparing said current check values with said new current threshold values;
    if said current check values exceed one or more said new current threshold values, generating a trip command for said leakage current protection device.

6. The method, according to claim 1, wherein said monitoring procedure comprises the following steps:
    obtaining voltage check values indicative of a variation over a predetermined period of time of said phase voltages;
    if said voltage check values are indicative of a positive variation of said phase voltages, comparing said voltage check values with predefined voltage threshold values.

7. The method, according to claim 6, wherein said step of providing said new current threshold values comprises the following steps:
    acquiring current detection values indicative of said leakage currents,
    calculating threshold correction values to correct said predefined current threshold values basing on said current detection values and said voltage check values;
    calculating said new current threshold values basing on said predefined current threshold values and said threshold correction values.

8. The method, according to claim 6, wherein said new current threshold values are predefined, said step of providing said new current threshold values comprises uploading said new current threshold values from a storage memory.

9. The method, according to claim 6, wherein the step of obtaining said voltage check values comprises the step of acquiring voltage detection values indicative of said phase voltages and the step of calculating said voltage check values on the base of said voltage detection values.

10. The method, according to claim 1, wherein the step of obtaining said voltage check values comprises the step of acquiring voltage detection values indicative of said phase voltages and the step of calculating said voltage check values on the base of said voltage detection values.

11. The method, according to claim 10, wherein said step of providing said new current threshold values comprises the following steps:
    acquiring current detection values indicative of said leakage currents;
    calculating threshold correction values to correct said predefined current threshold values basing on said current detection values and said voltage check values;

calculating said new current threshold values basing on said predefined current threshold values and said threshold correction values.

12. The method, according to claim 10, wherein said new current threshold values are predefined, said step of providing said new current threshold values comprises uploading said new current threshold values from a storage memory.

13. The method, according to claim 1, wherein said first control procedure comprises the following steps:
obtaining said current check values;
comparing said current check values with said predefined current threshold values,
if said current check values exceed one or more of said predefined current threshold values, generating a trip command for said leakage current protection device.

14. The method, according to claim 13, wherein the step of obtaining said current check values comprises the step of acquiring current detection values indicative of said leakage currents and the step of calculating said current check values on the base of said current detection values.

15. The method, according to claim 1, wherein said second control procedure comprises the following steps:
obtaining said current check values;
comparing said current check values with said new current threshold values,
if said current check values exceed one or more said new current threshold values, generating a trip command for said leakage current protection device.

16. The method, according to claim 15, wherein the step of obtaining said current check values comprises the step of acquiring current detection values indicative of said leakage currents and the step of calculating said current check values on the base of said current detection values.

17. A memory device for controlling a leakage current protection device in a photovoltaic apparatus, said photovoltaic apparatus being adapted to be electrically connected to an electric power distribution grid having one or more phase voltages at an AC section of said photovoltaic apparatus, the memory device comprising:
a set of instructions executable by processing resources effective to:
execute a first control procedure to control said leakage current protection device, said first control procedure providing for a comparison of current check values indicative of leakage currents in said photovoltaic apparatus with one or more predefined current threshold values for said leakage currents,
execute a monitoring procedure to check said phase voltages and identify possible relevant positive transients of said phase voltages,
if said monitoring procedure identifies relevant positive transients of said phase voltages, provide one or more new current threshold values for said leakage currents, terminate the execution of said first control procedure and executing a second control procedure to control said leakage current protection device, said second control procedure providing for a comparison of said current check values with said new current threshold values for said leakage currents, said second control procedure being executed for a predefined time interval only, and
after said predefined period of time has passed, terminate the execution of said second monitoring procedure and again executing of said first control procedure.

18. A control unit comprising processing resources configured to execute software instructions to control a leakage current protection device in a photovoltaic apparatus, the photovoltaic apparatus adapted to be electrically connected to an electric power distribution grid having one or more phase voltages at an AC section of said photovoltaic apparatus, the set of instructions executable by the processing resources effective to:
execute a first control procedure to control said leakage current protection device, said first control procedure providing for a comparison of current check values indicative of leakage currents in said photovoltaic apparatus with one or more predefined current threshold values for said leakage currents;
execute a monitoring procedure to check said phase voltages and identify possible relevant positive transients of said phase voltages;
if said monitoring procedure identifies relevant positive transients of said phase voltages, providing one or more new current threshold values for said leakage currents, terminating the execution of said first control procedure and executing a second control procedure to control said leakage current protection device, said second control procedure providing for a comparison of said current check values with said new current threshold values for said leakage currents, said second control procedure being executed for a predefined time interval only;
after said predefined period of time has passed, terminating the execution of said second monitoring procedure and again executing of said first control procedure.

* * * * *